SILICON SEMICONDUCTOR WITH METAL-SILICIDE HETEROJUNCTION

Filed May 29, 1967

Carmen F. Genzabella
Richard C. Wade
Inventors
by Alfred H. Rosen
Attorney

3,458,778
SILICON SEMICONDUCTOR WITH METAL-SILICIDE HETEROJUNCTION

Carmen F. Genzabella, North Andover, and Richard C. Wade, Saugus, Mass., assignors to Microwave Associates, Inc., Burlington, Mass., a corporation of Massachusetts Filed May 29, 1967, Ser. No. 641,882
Int. Cl. H01l 3/00, 5/00
U.S. Cl. 317—234 20 Claims

ABSTRACT OF THE DISCLOSURE

Semiconductor diodes are disclosed made of elemental silicon with an electrode of nickel, cobalt or iron bonded to the silicon via a region of silicide of the electrode metal formed in place by chemical reaction. The metal silicide is formed by locally heating the electrode and silicon to a temperature at which local melting occurs and the reaction takes place.

BACKGROUND OF THE INVENTION

The field of this invention is semiconductor diodes for use as microwave mixer and/or detector diodes.

For use as a microwave mixer and/or detector a semiconductor diode should exhibit a large conductance change under a very small bias charge. An ideal rectifier would have an infinite conductance at a small voltage in the forward region and zero conductance at zero bias. Secondly, the stored charge should be kept very small so that the diode may recover in a small fraction of an R-F cycle. However, in order to rectify the injected charge, it should not be allowed to re-enter the emitter region during the reverse cycle. The energy of the injected charge carrier must be reduced below that necessary to return to the emitter side during the reverse part of an R-F cycle. Therefore, in such a variable resistance device, the energy of the injected charge carriers must be dissipated through recombination, trapping, tunneling, and energy conversion to heat or light. Thirdly, the series resistance ($R_s$) and capacitance (C), whose product gives the time constant, must be kept at a minimum to reduce signal loss and noise contribution from thermal noise. Fourthly, R-F and D-C burn-out requirements should be as high as possible. Microwave mixer and/or detector diodes should have low thermal resistances and high thermal time constants. The thermal resistance, generally, depends on the active area of the diode; the larger the area, the smaller the thermal resistance. The higher the thermal time constant, the better the burn-out resistance.

Semiconductor rectifiers in the prior art may be found in two principal types—point-contact, and junction, and in forms that combine features of both types. Generally speaking, the point-contact type is characterized by an elongated electrode, or cat-whisker, which makes contact at its end or tip with a small region, or a "point," on a surface of a semiconductor body. Contact between the electrode tip and the semiconductor body is frequently stabilized by applying slight mechanical shock, or "tapping," during assembly. Tungsten, platinum, platinum alloys, and Phosphor bronze alloy are frequently used as whiskers. An example of silicon point contact diodes is described in U.S. Patent No. 2,824,269. It is also known to weld or "bond" the whisker tip directly to a semiconductor body, this being described in U.S. Patent No. 2,646,536, but devices made by this technique are useful as rectifiers only at very low frequencies, not higher than about 100 mc./sec.

As is well-known, a rectifying characteristic can be obtained in a semiconductor diode having a surface or boundary separating two parts of a semiconductor having different properties resulting from the introduction of impurities, for example, a junction between a region of N-type conductivity and a region of P-type conductivity in a single semiconductor crystal. Other types of junctions are also possible, depending on dopants and doping techniques employed; thus there may be NN junctions, PP junctions, NI junctions (where I refers to intrinsic semiconductor material) and so on. However, the capacitance (C) of the junction being a function of the area, the need to keep the time constant at a minimum restricts the area for higher-frequency applications. Attempts to meet this need led to point-contact diodes made with bonded whisker electrodes incorporating or coated with a dopant (i.e.: donor or acceptor) for the semiconductor body, which, upon being welded to the semiconductor body form a PN junction around the point of contact. Examples of this type of diode are shown in U.S. Patents Nos. 2,861,230 and 3,196,328. Many conventional point contact diodes currently available are actually PN junction diodes of this type. They have not been successfully operated as mixer diodes at microwave frequencies primarily because the large capacitances encountered in true PN junction devices increase the conversion loss to high values.

It is known that a rectifying contact can be formed between a metal and a semiconductor by an electroplating technique, such as the jet-plating technique. A rectifying barrier is formed at the metal-semiconductor surface. Nickel is particularly useful because it has a low surface barrier potential. The rectifying structure cannot be regarded as point contact, however, because the effective area of the rectifying contacts is appreciably larger than that of the usual point contact. Schottky-barrier diodes are examples of diodes of this type.

SUMMARY OF THE INVENTION

This invention relates in general to the formation of metal-semiconductor rectifying contacts on silicon, using a selected metal which is capable of forming a silicide compound with elemental silicon at an appropriate reaction temperature, to methods of forming such contacts, and in particular to the provision of semiconductor diodes having such rectifying contacts for use as microwave mixer and/or detector diodes. It is an object of the invention to make such diodes using prior-existing diode-fabrication techniques and processes, and in forms and shapes already known to the art and related industries.

As an example of a suitable metal is elemental nickel, which is known to form silicides when reacted at given temperatures with elemental silicon. The nickel silicide compound may vary in chemical proportions according to the chemical formula of the type $$Ni_{(a)}Si_{(b)}$$

where:

(a) can be any whole number integer from 1 to 5; and
(b) can be any whole number integer from 1 to 2;

All these compounds can be formed at a temperature in the range of 980° C. to 1330° C. Commonly-known nickel silicides have the chemical formulae NiSi: $NiSi_2$; $Ni_2Si$; $Ni_3Si$; $Ni_3Si_2$; $Ni_4Si$; and $Ni_5Si_2$. Thus, in this invention, the term "nickel silicide" is intended to mean any one of these compounds or any mixture of them. Accordingly, the nickel silicide-silicon interface can be interpreted as a heterojunction, which however differs substantially from the conventional semiconductor junction, such as a PN junction formed by alloying or doping techniques, in that conduction does not take place by a mechanism of holes and electrons involving minority and majority carriers, but rather takes place exclusively by a mechanism involving majority carriers created by di-pole layers.

It is thus another general object of the invention to provide novel heterojunction semiconductor diodes.

DESCRIPTION OF THE INVENTION

Exemplary embodiments of the invention, and methods to make them, are described with reference to the accompanying drawings, in which.

Figure 1:
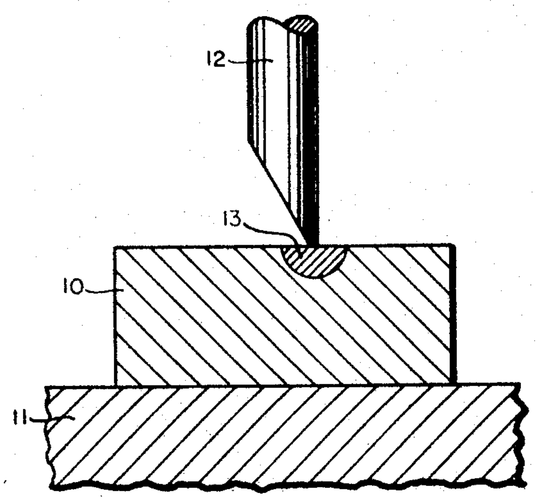
FIG. 1 illustrates schematically the essential elements of a diode according to the invention.

In FIG. 1, a semiconductor body in the form of a silicon die 10 is affixed at one side to an ohmic-contact electrode 11 in any known manner, as by a solder composed of 95% tin and 5% antimony. The silicon die may be in polycrystalline or single crystal form; it may be p- or n-type silicon, or intrinsic silicon; it is, however, in any event, elemental silicon. A point-contact type electrode 12, only the sharpened or whisker end of which is illustrated, and which may be made of nickel, or another metal as hereinafter described, is welded to another side of the die 10 at a temperature at which a region 13 of nickel silicide is formed in the die at the "point" where the whisker 12 makes contact with it. The welding technique may be similar to a conventional technique, for example as described in U.S. Patent No. 2,646,536, provided the electrical parameters of the welding circuit used are such that the appropriate temperature is established for the chemical reaction forming the metal silicide to take place. Localized heating, obtained by heat shocking or electrical pulsing is preferred, and is applied, in either electrical direction, to raise the local temperature in the die 10 under the whisker 12 to the level at which the metal silicide compound or compounds may be formed. This temperature level is reached, in the present example, by dissipating energy in a very small area, namely, the area of the die 10 just under the whisker point. Thereafter the metal-silicide compound region 13 is cooled, and the molten compound (or compounds) solidifies and regrows on the same orientation as the semiconductor body. The resulting contact is rigid, and yields a diode which has superior properties than prior art diodes for microwave mixer and/or detector applications.

Metals which will form metal silicide-silicon heterojunctions according to the invention are nickel, cobalt and iron. Examples of some, the metal silicides they form, the temperature range of the chemical reaction, and the diode rectifier properties achieved at microwave frequencies (defined for this purpose as any frequency in excess of 1 gHz.), are stated in the following table:

TABLE I

| Metal | Silicide(s) | Reaction Temperature, ° C. | Reverse | | Forward | | Noise Figure (db) X Band | |
|---|---|---|---|---|---|---|---|---|
| | | | M.A. | Volts | M.A. | Volts | Invent. | Pt. Cont. |
| Ni | $Ni_{(a)}Si_{(b)}$ | 980–1,330 | 1 | 5 | 20 | .6 | 5.5 | 6.0 |
| Co | $Co_{(a)}Si_{(b)}$ | 1,160–1,480 | 1 | 5 | 20 | 1.0 | 6.5 | —$x$ |
| Fe | $Fe_{(a)}Si_{(c)}$ | 1,200–1,460 | 1 | 4 | 20 | 1.0 | 8.0 | —$x$ |

(a)=any integer from 1 to 5
(b)=any integer from 1 to 2
(c)=any integer from 1 to 3
$x$=not available; not known to be made "X-Band" means the frequency range from 7.5 to 10.4 gHz. approximately.

The electrode 12 may have a diameter of about ¼ to 10 mils (that is, about $6\times10^{-4}$ to $254\times10^{-4}$ cm.). The tip may be chisel-pointed, as shown, or otherwise pointed. The region 13 of metal silicide may consist of one or more metal silicides formed in place, and has a surface or junction in common with the elemental silicon of the die 10; the illustration represents a semiconductor heterojunction.

A semiconductor heterojunction for the purposes of this invention may be defined as an intimate contact between any material and a semiconducting material producing an interface. With respect to quantum mechanical theory, the wave function of the electrons in one side of the heterojunction may penetrate the other side. This occurs, in most cases not involving minority carriers, to a distance of a few angstroms. Consequently, the electrical conduction process changes as current passes through such junctions. Sometimes the changes are very significant and occur only at the interface. When two different homogeneous materials, which are even slightly conducting in nature, are in intimate contact the Fermi levels of the two materials may be oriented by the transfer of charge. In the case of heterojunctions according to the present invention, involving contact between elemental silicon and a metal silicide of the type described, this charge transfer creates a dipole layer which penetrates into both materials producing a potential difference. Work must be spent to move a charged particle over this barrier, and the quantity of work is independent of the path or direction. This work is related to the difference of the electron affinity which exists at the interfacial barrier, the dipole produced by the exchange of charge, the dipole produced from the polar difference between the two materials, and the force of attraction resulting from surface charges. The surface potential determined by the density of electronic states is independent of the doping level. The region in close proximity to the surface and interface has associated with it electric fields produced from the charge transfer between the surface and bulk or between the two materials. This electric field aids in the formation of the diffusion potentials. The diffusion potential, in this case, is dependent on the doping level. All these factors contribute to changes in the quantum mechanical conduction in which a number of mechanisms such as recombination, injection, trapping and tunneling are involved.

Heterojunctions according to the invention can utilize both p- and n-type silicon as the semiconductor body 10, as well as intrinsic silicon.

Figure 2:
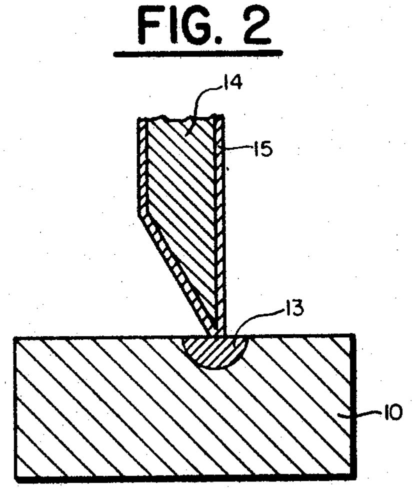
FIG. 2 illustrates a modification of FIG. 1.

FIG. 2 shows a modification of FIG. 1, in which the whisker electrode 12 of FIG. 1 is changed to an electrode in the form of a neutral member 14 plated or otherwise coated with a transition metal 15. Any available plating or coating technique may be used. A neutral element may be defined, for purposes of this invention, as any material which does not form a silicide with elemental silicon, and which does not dope elemental silicon (i.e.: which is not a donor or an acceptor material for silicon). Elements which do not form silicides with and which do not dope elemental silicon include gold, silver, tungsten and molybdenum. Diodes have been made using electrodes 14, 15 made of nickel-plated tungsten, nickel-plated molybdenum, cobalt-plated tungsten, cobalt-plated molybdenum, iron-plated tungsten, and iron-plated molybdenum. While tungsten and molybdenum can form silicides, when coated with nickel cobalt or iron they do not do so because the latter form silicides at lower reaction temperatures. Thus, for molybdenum the reaction temperature is 2000° C., while for tungsten it is 2165° C.

Figure 3:
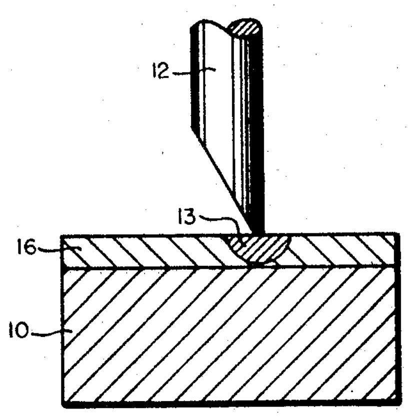
FIG. 3 illustrates schematically the essential elements of another diode according to the invention.

As is mentioned above, the semiconductor body 10 can be a homogeneously doped p- or n-type silicon or intrinsic silicon. It can also be a body of extrinsic or intrinsic silicon with an epitaxially-deposited layer of silicon having p- or n-type impurities present, or also intrinsic. FIG. 3 illustrates such an embodiment of the invention, in which the silicon body 10 has an epitaxially-deposited layer 16 of silicon, to which the whisker electrode makes contact, and in which the region 13 of metal silicide compound is formed. The heterojunction is formed in the epitaxial layer 16. The silicon body 10, and the layer 16, can each be extrinsic, or intrinsic, and if extrinsic can be doped as desired. The invention is useful for microwave mixing and detecting purposes with any combination of these parameters.

Figure 4:
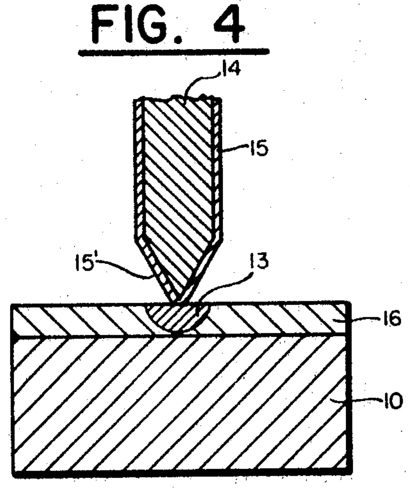
FIG. 4 illustrates modifications of FIG. 3.

FIG. 4 shows an embodiment according to FIG. 3 employing a plated whisker electrode 14, 15 like the electrode 14, 15 of FIG. 2. The point 15' of this electrode is round, rather than chisel shaped, illustrating that the shape of the point is not material. In all embodiments of the invention, the point may be formed in any shape, and by any process, such as electrolytic etching or mechanical grinding. When a plated electrode is used, however, the transition metal 15 should be coated on the neutral member 14 after the point has been formed.

The parts shown in the drawings may be held together and enclosed by any diode housing, preferably suitable for use in the microwave frequency range. As is mentioned above, techniques and methods which are known in the art of semiconductor diode fabrication are useful to make diodes of the present invention.

The embodiments of the invention which have been illustrated and described herein are but a few illustrations of the invention. Other embodiments and modifications will occur to those skilled in the art. No attempt has been made to illustrate all possible embodiments of the invention, but rather only to illustrate its principles and the best manner presently known to practice it. Therefore, while certain specific embodiments have been described as illustrative of the invention, such other forms as would occur to one skilled in this art on a reading of the foregoing specification are also within the spirit and scope of the invention, and it is intended that this invention includes all modifications and equivalents which fall within the scope of the appended claims.

What is claimed is:

1. Method of making a semiconductor rectifier device particularly suited for mixing and detecting electric wave signals in the microwave frequency range comprising the steps of (1) providing a body of semiconductor-grade elemental silicon;

(2) bringing into contact with said body an electrode comprised essentially of at least one metal selected from the group consisting of iron, cobalt and nickel;

(3) locally heating said body and said electrode in said contact with each other to a temperature at which said metal reacts chemically with said body to form a region of silicide of said metal; and (4) cooling said region to form a solidified region of said metal silicide by regrowth on the same orientation as said semiconductor body, and thereby forming a rugged mechanical bond with said metal of said electrode and a heterojunction with said silicon.

2. Method according to claim 1 in which said electrode is made of a core selected from tungsten and molybdenum, and said metal is carried on said core, and said local heating is done at a temperature substantially less than 2000° C.

3. Method according to claim 1 in which said electrode is made of a core selected from one of said metals and another of said metals is carried on said core, and said other metal is brought into contact with said body.

4. Method according to claim 1 in which said body is p-type silicon.

5. Method according to claim 1 in which said body is N-type silicon.

6. Method according to claim 1 in which said body is intrinsic silicon.

7. Method according to claim 1 in which said electrode is a point-contact type electrode.

8. Method according to claim 1 in which said body has an epitaxial layer of silicon on a surface thereof, and said electrode is brought into contact with said layer, and said region is formed exclusively in said layer.

9. Method according to claim 8 in which said electrode is a point contact type electrode.

10. A semiconductor rectifier device particularly suited for mixing and detecting electric wave signals in the microwave frequency range comprising (1) a body of elemental silicon;

(2) in contact with said body an electrode comprised essentially of at least one metal selected from the group consisting of nickel, cobalt and iron; and (3) a region of silicide of said metal on the same orientation as said semiconductor body between said electrode and said body and forming a mechanical bond with said metal of said electrode and a heterojunction with said silicon.

11. A semiconductor device according to claim 10 in which said electrode is a point-contact electrode.

12. A semiconductor device according to claim 11 in which said body has an epitaxial layer of silicon on it, said electrode is in point-contact with said layer, and said region exists exclusively in said layer and forms said heterojunction with the silicon of said layer.

13. A semiconductor device according to claim 11 in which said electrode is a wire-like member made of a metal selected from tungsten and molybdenum, and said metal selected from said group is coated on said member.

14. A semiconductor device according to claim 12 in which said electrode is a wire-like member made of a metal selected from tungsten and molybdenum, and said metal selected from said group is coated on said member.

15. Method of making a semiconductor rectifier device particularly suited for mixing and detecting electric wave signals in the microwave frequency range comprising the steps of (1) providing a body of elemental silicon having an epitaxial layer of silicon on a surface thereof;

(2) bringing into contact with said layer an electrode comprised essentially of at least one metal selected from the group consisting of metals capable of forming silicides when reacted chemically with silicon, but excluding materials which are substantially capable of functioning as donor or acceptor when alloyed with silicon;

(3) locally heating the regions of said layer and said electrode in said contact with each other to a temperature at which said electrode reacts with said layer to form in said layer a molten pool of silicide of said metal; and (4) cooling said region to form exclusively in said layer a solidified region of said metal silicide by regrowth on the same orientation as said layer, and thereby forming a rugged mechanical bond with said metal of said electrode and a heterojunction with the silicon of said layer.

16. Method according to claim 15 in which said electrode is a point-contact-type of electrode.

17. Method according to claim 16 in which said electrode is made of a core selected from tungsten and molybdenum, and said metal is carried on said core, and said local heating is done at a temperature substantially less than 2000° C.

18. A semiconductor rectifier device particularly suited for mixing and detecting electric wave signals in the microwave frequency range comprising (1) a body of elemental silicon having an epitaxial layer of silicon on a surface thereof;

(2) in contact with said layer an electrode comprised essentially of at least one metal selected from the group consisting of metals capable of forming silicides when reacted chemically with silicon, but excluding materials which are substantially capable of functioning as donor or acceptor when alloyed with silicon; and (3) a region of silicide of said metal on the same orientation as said semiconductor body between said electrode and said layer and forming a mechanical bond with said metal of said electrode and a heterojunction with said layer.

19. Device according to claim 18 in which said electrode is a point-contact-type of electrode.

20. Device according to claim 19 in which said electrode is made of a core selected from tungsten and molybdenum and said metal is carried in said core.

References Cited

UNITED STATES PATENTS

| | | | |
|---|---|---|---|
| 3,169,304 | 2/1965 | Gould | 29—155.5 |
| 3,290,127 | 12/1966 | Kahng et al. | 29—195 |
| 3,297,922 | 1/1967 | Uhlir et al. | 317—236 |

JOHN W. HUCKERT, Primary Examiner

R. F. POLISSACK, Assistant Examiner

U.S. Cl. X.R.

29—584, 587; 148—177, 179, 183, 185; 317—236